(12) United States Patent
Tei et al.

(10) Patent No.: US 11,139,022 B1
(45) Date of Patent: Oct. 5, 2021

(54) SOURCE LINE VOLTAGE CONTROL FOR NAND MEMORY

(71) Applicant: SanDisk Technologies LLC, Addison, TX (US)

(72) Inventors: Kou Tei, San Jose, CA (US); Ohwon Kwon, Pleasanton, CA (US); Jongyeon Kim, Milpitas, CA (US); Chia-Kai Chou, San Jose, CA (US); Yuedan Li, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/908,467

(22) Filed: Jun. 22, 2020

(51) Int. Cl.
*G11C 7/02* (2006.01)
*G11C 11/4091* (2006.01)
*G11C 11/4074* (2006.01)
*G11C 5/02* (2006.01)
*G11C 11/4096* (2006.01)
*G11C 11/4076* (2006.01)

(52) U.S. Cl.
CPC .......... *G11C 11/4091* (2013.01); *G11C 5/025* (2013.01); *G11C 11/4074* (2013.01); *G11C 11/4076* (2013.01); *G11C 11/4096* (2013.01)

(58) Field of Classification Search
CPC . G11C 11/4091; G11C 5/025; G11C 11/4074; G11C 11/4076; G11C 11/4096
USPC .......................................................... 365/207
See application file for complete search history.

(56) References Cited

U.S. PATENT DOCUMENTS

| | | |
|---|---|---|
| 2013/0077405 A1 | 3/2013 | Kato et al. |
| 2013/0279255 A1 | 10/2013 | Kamata et al. |
| 2013/0286738 A1 | 10/2013 | Kamata |
| 2019/0267092 A1* | 8/2019 | Joe ...................... G11C 11/5671 |
| 2021/0020256 A1* | 1/2021 | Kim ..................... G11C 11/5628 |

* cited by examiner

*Primary Examiner* — Huan Hoang
(74) *Attorney, Agent, or Firm* — Vierra Magen Marcus LLP

(57) ABSTRACT

An example of an apparatus includes a plurality of memory cells arranged in a plurality of NAND strings that are connected to a source line and a control circuit connected to the source line. The control circuit is configured to provide a first current to the source line to pre-charge the source line to a target voltage for sensing data states of the plurality of memory cells and provide a second current to the source line to return the source line to the target voltage in a recovery period between sensing data states. The control circuit is configured to provide the second current at any one of a plurality of current levels.

22 Claims, 15 Drawing Sheets

(Prior Art)

SOURCE LINE VOLTAGE CONTROL FOR NAND MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Flash memory may utilize floating-gate transistors or charge-trap transistors. In the case of floating gate transistors, for each floating-gate transistor, a floating gate is positioned adjacent to and insulated from a channel region of the floating-gate transistor. The channel region is positioned between source and drain regions of the floating-gate transistor. A control gate is positioned adjacent to and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (e.g., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. NAND strings may be oriented such that the strings are orthogonal to a substrate of a memory die (e.g., 3D vertical NAND strings). In recent years, NAND flash memory has been scaled in order to reduce cost per bit. However, as process geometries shrink, many challenges are presented.

DETAILED DESCRIPTION

Figure 1:
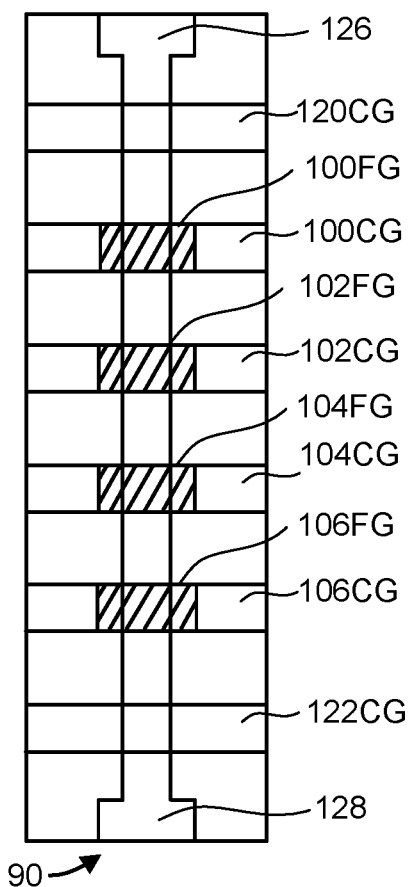
FIG. 1 depicts one embodiment of a NAND string.

Technology is described for controlling the voltage of a source line in a NAND memory, including for example, pre-charging a source line to a target voltage and returning the source line to the target voltage (e.g. during recovery periods that may allow for such recovery). A pre-charge and recovery circuit may provide a pre-charge current to pre-charge the source line. The pre-charge current may be a relatively high current to rapidly increase source line voltage to the target voltage. The pre-charge current may be controlled based on feedback from the source line (e.g. may be turned off when the source reaches the target voltage). Subsequently, in a recovery period, the pre-charge and recovery circuit may provide a recovery current to return the source line to the target voltage. The recovery current may be a relatively low current (compared to the pre-charge current). The recovery current may be provided for a predetermined time (e.g. independent of any feedback from the source line). The recovery current may be tuned to ensure that it returns the source line to the target voltage during the predetermined time without causing an unacceptable level of instability. For example, a pre-charge and recovery circuit may be capable of providing the recovery current at any one of a plurality of current levels and a suitable current level may be selected based on testing (e.g. the current level that returns a source line to the target voltage with least instability from the plurality of current levels tested). Selection may occur during die testing (die-sort) and an indicator of the selected recovery current may be stored for subsequent use. The recovery current may be provided during recovery periods between sense steps to sense different data states. Voltage drop and instability caused by, for example, locking out of certain bitlines at the end of a sense step may be addressed by using an appropriate recovery current that is selected based on testing.

A sensing step (sensing pass) may be performed during a read operation (e.g., to determine the stored data state of a memory cell) or during a program verify operation (e.g., to determine whether a memory cell has been programmed to the desired data state). During the sensing step, a set of sense amplifiers or sensing circuitry may be connected to a set of memory cells being sensed. The sense amplifiers may allow bit lines connected to the memory cells to discharge at a rate dependent on the amount of current discharging through the memory cells or memory cell transistors connected to the bit lines for a sensing time (e.g., 1.1 us or 2.24 us). After the sensing time has occurred, the changes in voltages due to the amount of discharge per bit line may be sampled and/or compared to determine whether the memory cells have threshold voltages greater than a reference voltage (e.g., whether a particular memory cell transistor has a threshold voltage greater than 3V). A longer sensing time may provide memory cells a longer time to discharge an integration capacitor within the sense amplifier and/or bit line capacitance connected to the sense amplifier.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
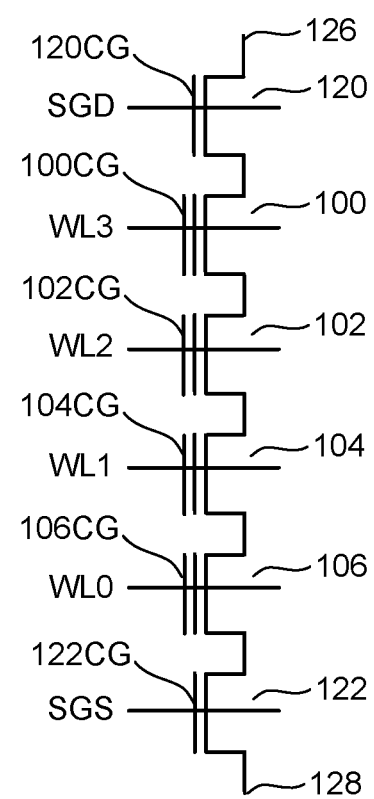
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors arranged in a NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

One architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

No particular non-volatile memory technology is required for purposes of the new embodiments proposed herein. Other examples of suitable technologies for memory cells include ReRAM memory, magnetoresistive memory (e.g., MRAM), phase change memory (e.g., PCM), and the like. One example of a ReRAM or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper) with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. Phase change memory (PCM) may exploit the unique behavior of chalcogenide glass.

A person of ordinary skill in the art will recognize that the technology described herein is not limited to a single specific memory structure, but covers many relevant memory structures within the spirit and scope of the technology as described herein and as understood by one of ordinary skill in the art.

Figure 3A:
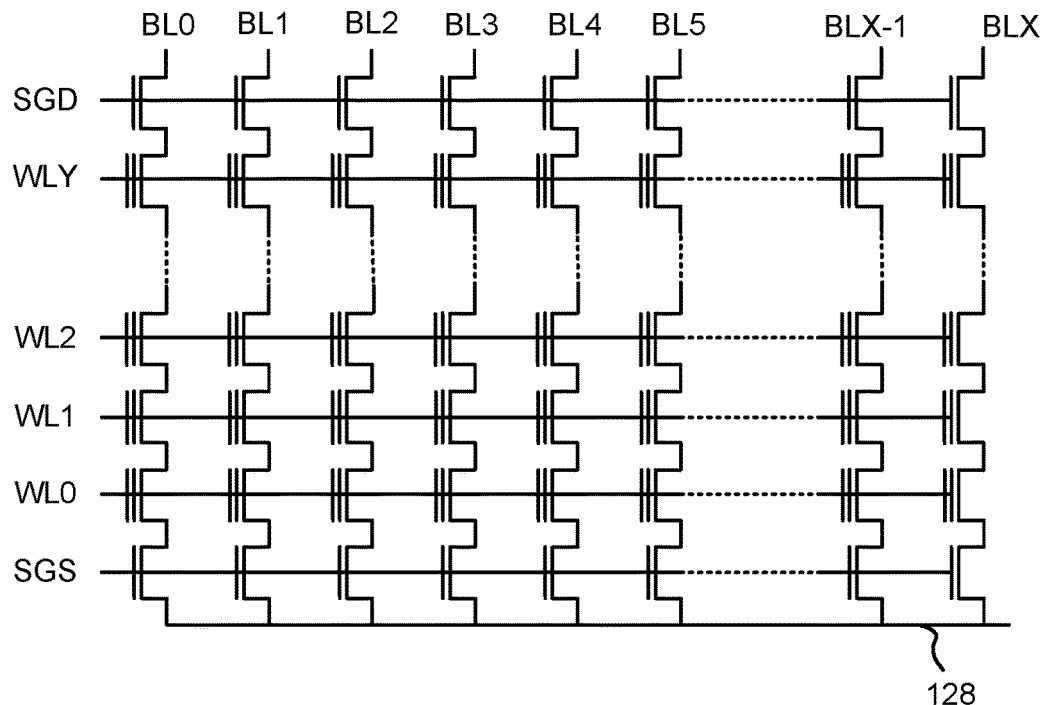
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line 128 (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor (e.g., an integration capacitor) in a sense amplifier. In another example, the conduction current of the selected memory cell allows (or fails to allow) the NAND string that included the memory cell to discharge a voltage on the corresponding bit line. The voltage of the bit line may be measured after a period of time (e.g., after a sensing time during which the bit line has been discharged) to determine whether the bit line has been discharged by a particular amount or not.

Figure 3B:
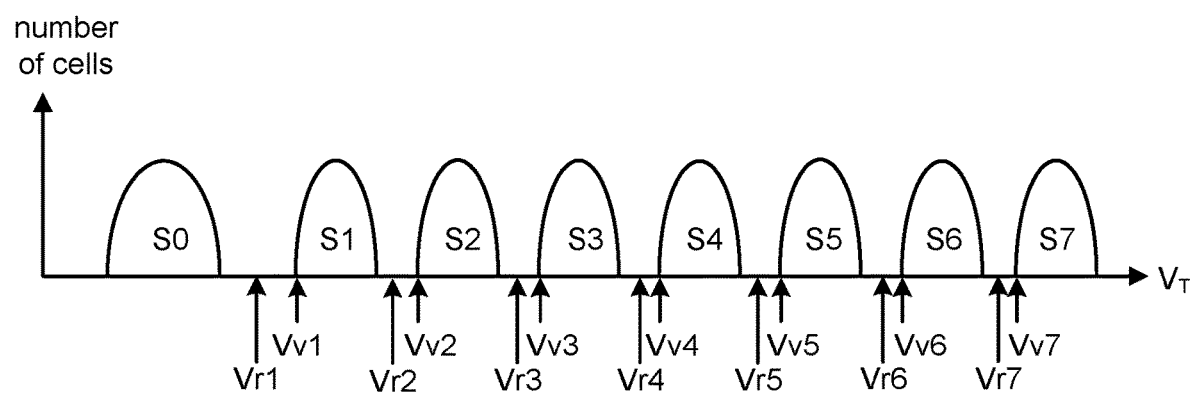
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells are erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read voltages Vr1, Vr2, Vr3, Vr4, Vr5, Vr6, and Vr7 to determine which state the memory cells are in. If a memory cell turns on in response to read voltage Vr1, then it is in state S0. If a memory cell turns on in response to Vr2 but does not turn on in response to read voltage Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
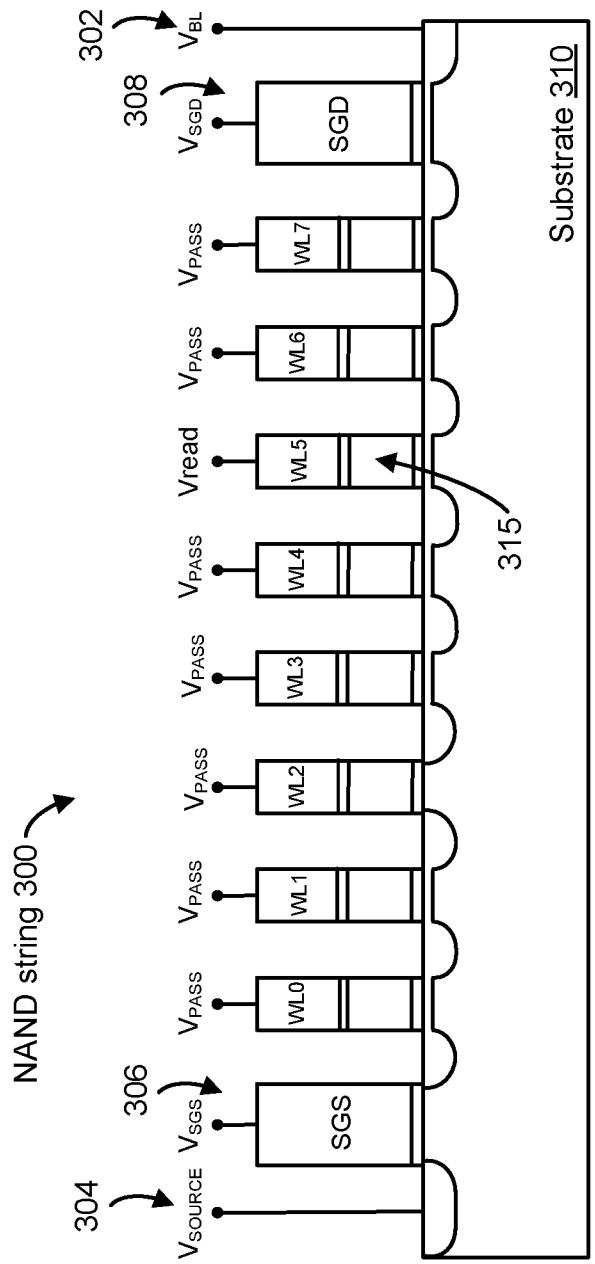
FIG. 3C depicts one embodiment of a NAND string.

FIG. 3C depicts one embodiment of a NAND string 300 during a read or verify operation. As depicted, the NAND string 300 includes a source-side select gate 306, a drain-side select gate 308, and eight word lines WL0-WL7 formed above a substrate 310. VSGS may be applied to the source-side select gate 306 and $V_{SGD}$ may be applied to the drain-side select gate 308 to turn these select gates on. The bit line 302 may be pre-charged to $V_{BL}$ for a read or verify operation and the source line 304 may be biased to $V_{SOURCE}$. A read voltage, Vread, is applied to a selected word line (WL5 in this example), which is coupled to a memory cell 315 that is being read. Other word lines WL0-WL4 and WL6-WL7 receive a read pass voltage, Vpass that turns on respective memory cells so that electrical current through NAND string 300 depends on memory cell 315.

Figure 3D:
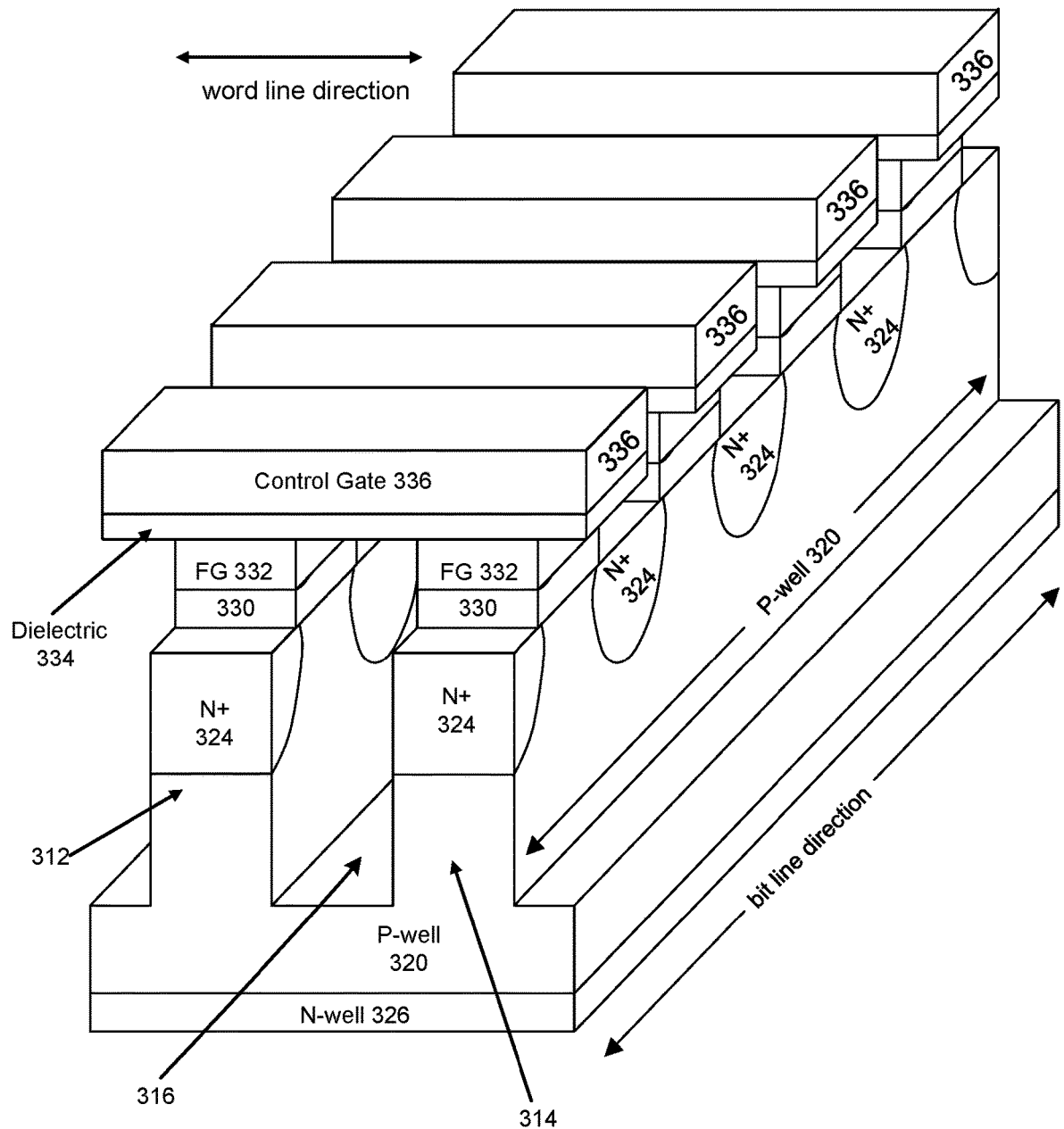
FIG. 3D depicts one embodiment of two NAND strings that may be fabricated as part of a larger flash memory array.

FIG. 3D depicts one embodiment of two NAND strings 312 and 314 that may be fabricated as part of a larger flash memory array. As depicted, NAND strings 312 and 314 each include four memory cells, n-type diffusions 324, and a portion of a shared P-well 320. Each memory cell in a NAND string includes a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 312 is separated from NAND string 314 by an isolation region 316. The isolation region 316 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
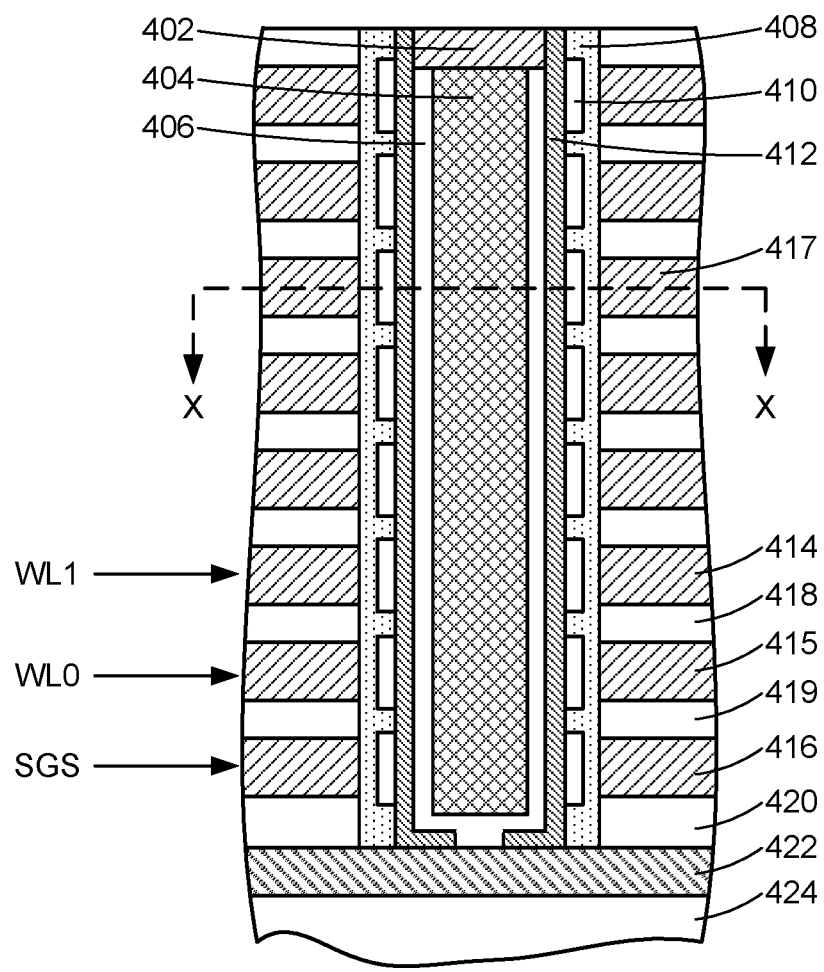
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon or an N-well layer) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride). Therefore, the vertical NAND structure depicted in FIG. 4A may be implemented using either floating-gate transistors or charge-trap transistors.

Figure 4B:
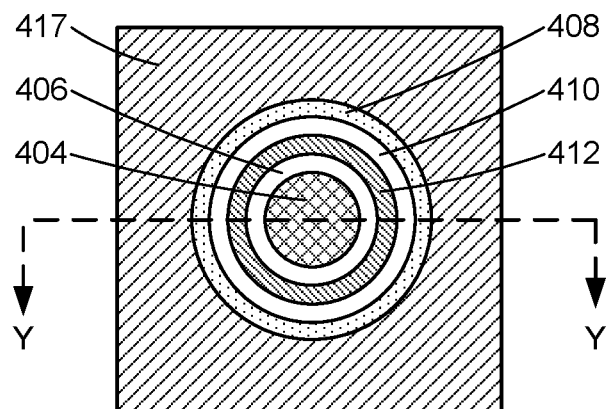
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 4C:
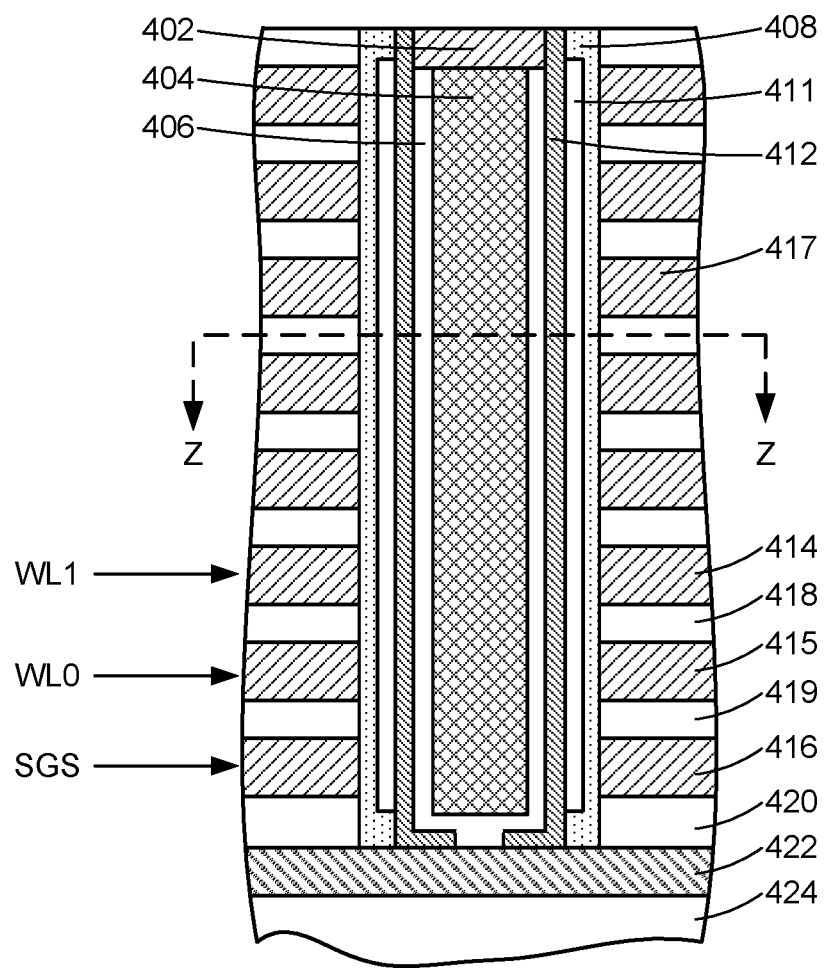
FIG. 4C depicts another embodiment of a vertical NAND structure.

FIG. 4C depicts another embodiment of a vertical NAND structure. The vertical NAND structure of FIG. 4C is similar to that depicted in FIG. 4A except that the floating gate material 410 has been replaced with a charge trap material 411 (e.g., silicon nitride). The vertical NAND string is formed above the substrate 424 and oriented such that the vertical NAND string is orthogonal to the substrate 424. The vertical NAND string may be arranged within a vertical memory hole that is etched through alternating layers of word line material (e.g., tungsten or polysilicon) and an insulator material (e.g., oxide or silicon oxide).

Figure 4D:
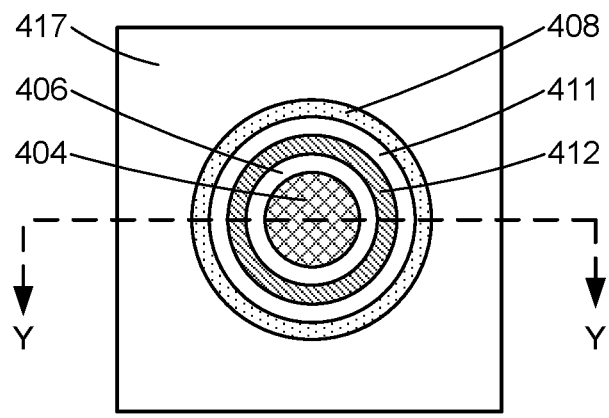
FIG. 4D depicts one embodiment of a cross-sectional view taken along line Z-Z of FIG. 4C.

FIG. 4D depicts one embodiment of a cross-sectional view taken along line Z-Z. As depicted, the vertical NAND string includes an inner core material layer 404 that is surrounded by the channel layer material 406 that is surrounded by the tunneling layer material 412 that is surrounded by the charge trap material 411 that is surrounded by the dielectric material 408 that is surrounded by the insulator material 418 (e.g., silicon dioxide). In one embodiment, FIG. 4C may depict a cross-sectional view taken along line Y-Y of FIG. 4D. In one embodiment, the vertical NAND string may be formed using a vertical cylindrical structure or a vertical tapered cylindrical structure. In this case, the dielectric material 408, charge trap material 411, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
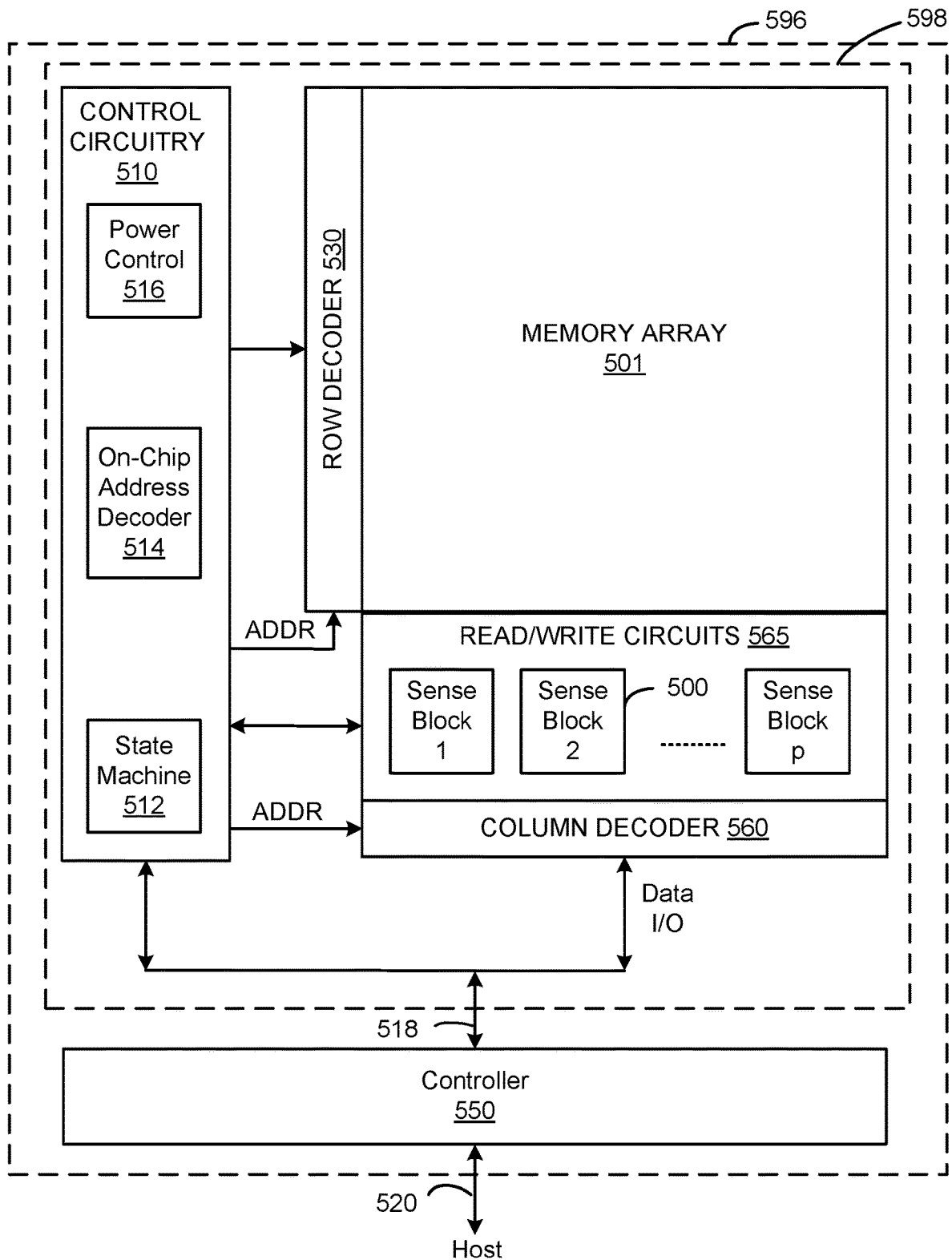
FIG. 5 depicts one embodiment of a non-volatile storage system including read/write circuits for reading and programming a page

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines of data bus 520 and between the controller 550 and the memory die 598 via lines 518.

In one embodiment, the control circuit(s) are formed on a first die, referred to as a control die, and the memory array is formed on a second die, referred to as a memory die. For example, some or all control circuits (e.g. control circuitry 510, row decoder 530, column decoder 560, and read/write circuits 565) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g. one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

Figure 6:
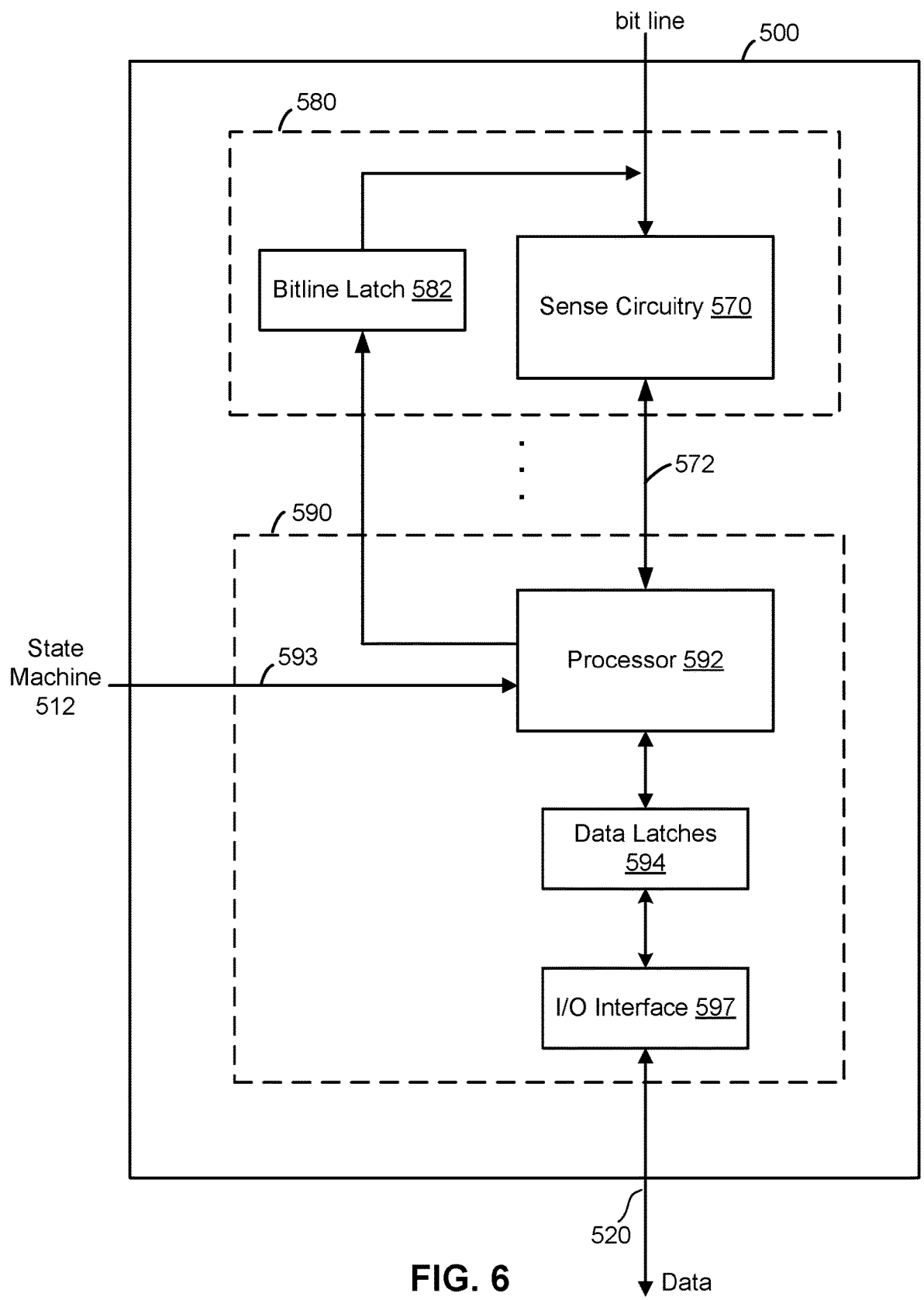
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 597 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 597 provides an interface between data latches 594 and the data bus 520.

During a read operation, verify operation, or other storage element sensing operation, a state machine, such as state machine 512 in FIG. 5, controls the supply of different control gate voltages to the addressed storage elements. As it steps through the various predefined control gate voltages corresponding to the various data states supported by the memory, the sense module 580 may trip at one of these voltages and an output will be provided from sense module 580 to processor 592 via bus 572. At that point, processor 592 determines the resultant data state by consideration of the tripping event(s) of the sense module and the information about the applied control gate voltage from the state machine via input lines 593. It then computes a binary encoding for the data state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired data state. Processor 592 monitors the read back data state relative to the desired data state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latches 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Sensing the data state of a selected memory cell (e.g. by sense block 500) may be affected by a number of factors. One example of a factor that may affect sensing of such a selected memory cell is the voltage that is present on a source line coupled to the NAND string that includes the selected memory cell. For example, as shown in FIG. 3A, a number of NAND strings may be connected to source line 128. Source line 128 may be brought to a desired source line voltage for a sensing operation (e.g. for a read or verify operation). In some cases, variations in source line voltage (e.g. deviation from a desired source line voltage) may occur and may have a negative impact on sensing of data states of memory cells in NAND strings that are connected to the source line. Instability of source line voltage may occur for a number of reasons at different times. An example of such instability may occur at the end of a sense step or during transition between sense steps.

When sensing data states of memory cells (e.g. reading data states or verifying data states), a series of sense steps may occur, with each sense step corresponding to a different data state (different threshold voltage range). After a given sense step (e.g. after a verify step to see if threshold voltage of a memory cell has reached Vv1 or a read step to see if threshold voltage of a memory cell has reached Vr1 in FIG. 3B) a recovery period may occur before a subsequent sense step begins (e.g. before a verify step to see if threshold voltage of the memory cell has reached Vv2 or a read step to see if threshold voltage of a memory cell has reached Vr2). Such a recovery period may allow one or more parameters to be changed and/or allow for stabilization. For example, control gate voltage applied by a selected word line may be transitioned for a subsequent sense step and may be stabilized at a new voltage level during the recovery period.

In some cases, source line voltage (e.g. voltage of source line 128) may exhibit some instability at the end of a sense step and/or during transition between sense steps. Source line voltage (e.g. voltage on source line 128) may be returned to a target voltage and stabilized at the target voltage in a recovery period. For example, when a sense operation directed to sense voltage Vv1 or Vr1 ends, memory cells that are in the S0 state may be identified and corresponding bitlines may be locked out (e.g. locked out by bitline latch 582). Locked out bit lines may be brought to a low voltage (e.g. a voltage at or near the target source line voltage). The effects of locking out some bitlines while other bitlines remain at a higher voltage may include instability in a source line voltage. For example, bitlines may be capacitively coupled to a source line so that reducing bit line voltage may cause a drop in source line voltage. This may cause fluctuation or instability in source line voltage. Such instability may negatively impact sensing of subsequent data states. In some cases, circuits coupled to the source line may be configured so that such instability is reduced to an acceptable level or eliminated.

Figure 7:
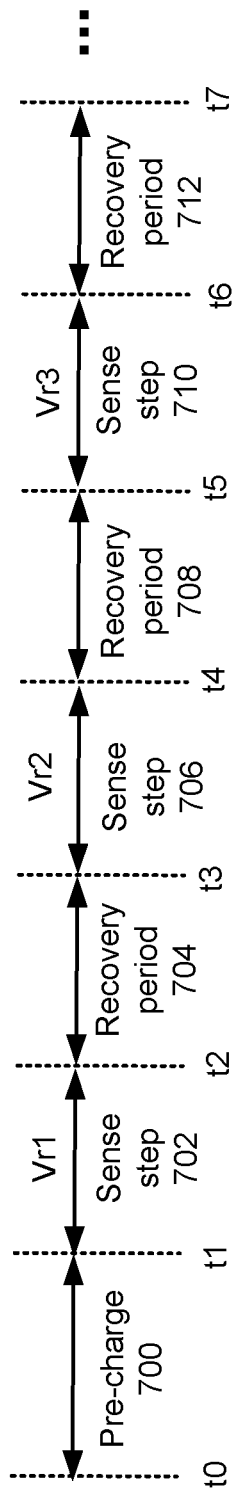
FIG. 7 illustrates an example of recovery periods between sense steps.

FIG. 7 illustrates an example of a read operation (e.g. reading data states of memory cells arranged in NAND strings as shown in FIG. 3A) that includes multiple sense steps (read steps, in this example), each read step corresponding to a data state (e.g. each read step directed to one of the data states S0 to S7 illustrated in FIG. 3B). In a pre-charge step 700, from time t0 to t1, source line 128 may be pre-charged to a target voltage (e.g. 1.1 volts) that is used during sensing of data states. In a first sense step 702 that extends from time t1 to t2, read voltage Vr1 is used to identify memory cells in the S0 data state (e.g. memory cells that turn on with read voltage Vr1 are in the S0 data state and may be identified by current flow from corresponding bitlines). At the end of first sense step 702, corresponding bitlines are locked out (e.g. bitline voltage may be reduced to a voltage at or near voltage of source line 128), which may cause a drop in voltage on source line 128. In a first recovery period 704 that extends from time t2 to t3, voltage on source line 128 may be returned to a target voltage. In a second sense step 706 that extends from time t3 to t4, read voltage Vr2 is used to identify memory cells in the S1 state (e.g. memory cells that turn on with a read voltage Vr2 and did not turn on with read voltage Vr1 are in the S1 data state and may be identified by current flow from corresponding bitlines). At the end of second sense step 706, corresponding bitlines are locked out (e.g. bitline voltage may be reduced to a voltage at or near voltage of source line 128), which may cause a drop in voltage on source line 128. In a second recovery period 708 that extends from time t4 to t5, voltage on source line 128 may be returned to a target voltage. In a third sense step 710 that extends from time t5 to t6, read voltage Vr3 is used to identify memory cells in the S2 data state (e.g. memory cells that turn on with read voltage Vr3 and did not turn on with read voltages Vr1 and Vr2 are in the S2 data state and may be identified by current flow from corresponding bitlines). At the end of third sense step 710, corresponding bitlines are locked out (e.g. bitline voltage may be reduced to a voltage at or near voltage of source line 128), which may cause a drop in voltage on source line 128. In a third recovery period 712 that extends from time t6 to t7, voltage on source line 128 may be returned to a target voltage. Additional sense steps and recovery periods may be provided according to the number of data states to be sensed in given a Multi Level Cell (MLC) configuration. It will be understood that the dimensions of FIG. 7 are not intended to accurately represent the durations of the time intervals shown (e.g. sense steps may be longer than recovery periods).

In general, providing recovery periods between sense steps may facilitate stability of voltages (e.g. source line voltage) at their target levels (e.g. source line voltage at 1.1 volts) when sensing is performed and thereby facilitate accurate sensing of data states of memory cells (e.g. with few bad bits). Providing sufficient current to return source line voltage to a target level without excessive instability and within a short time may be challenging. Aspects of the present technology are directed to recovery of source line current in a manner that does not produce excessive instability and can be performed rapidly.

Figure 8:
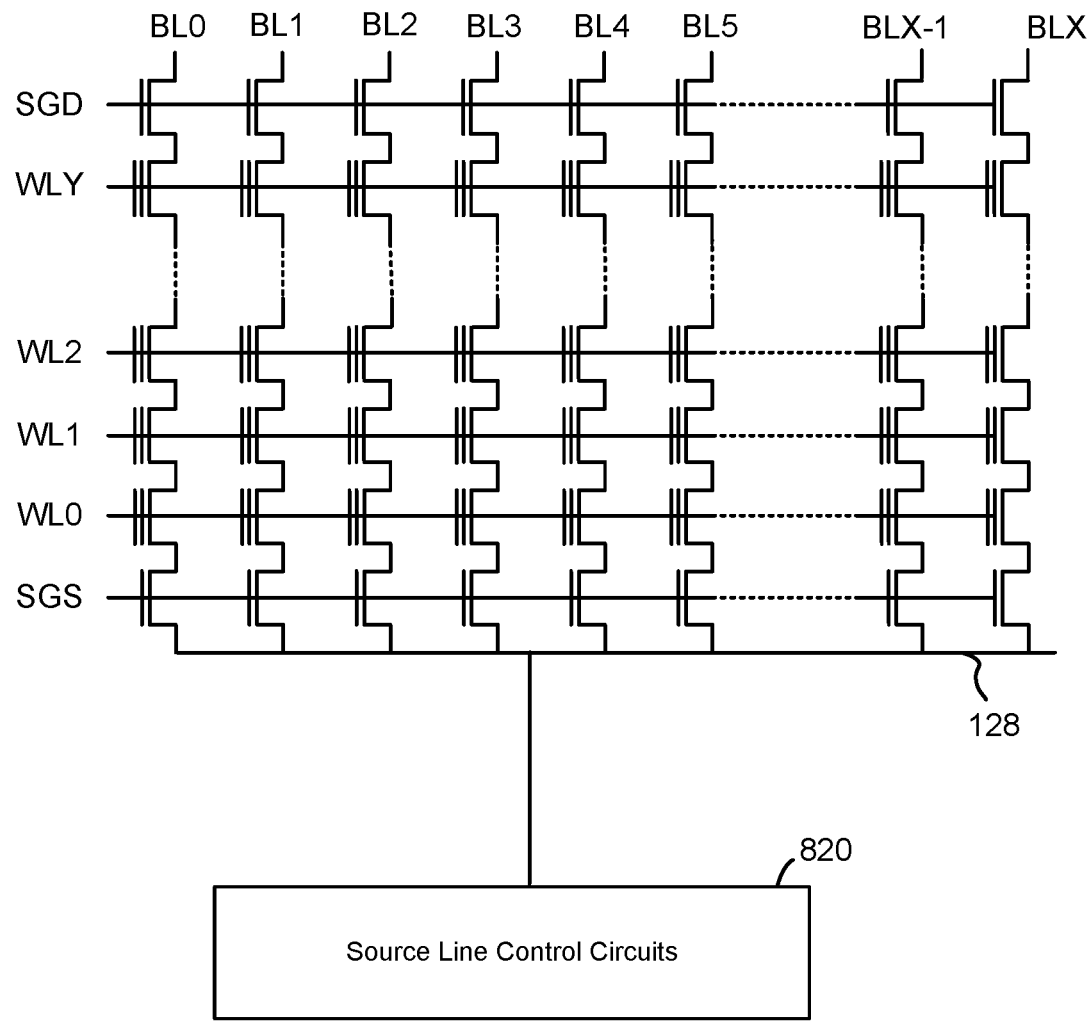
FIG. 8 illustrates an example of source line control circuits connected to source line.

FIG. 8 illustrates an example of source line 128 connected to source line control circuits 820. Source line control circuits 820 may be implemented in read/write circuits 565 and/or control circuitry 510. Source line control circuits may be located on a memory die (e.g. source line control circuits may be located on the same die as the memory cells to which they are coupled). In another arrangement, source line control circuits are located on a control die that is bonded to a memory die to form an integrated memory assembly (e.g. source line control circuits located on a different die to the memory cells to which they are coupled). Source line control circuits 820 may include circuits to change the voltage on source line 128 (e.g. to drive current into source line 128 to raise voltage of source line 128 and/or sink current from source line 128 to lower voltage of source line 128). Source line control circuits 820 may be configured to maintain a voltage at a target voltage level during an operation, for example, during reading, writing, or erasing. In general, it may be desirable that such a voltage is stable during an operation (e.g. with little or no deviation from the target voltage).

Figure 9A:
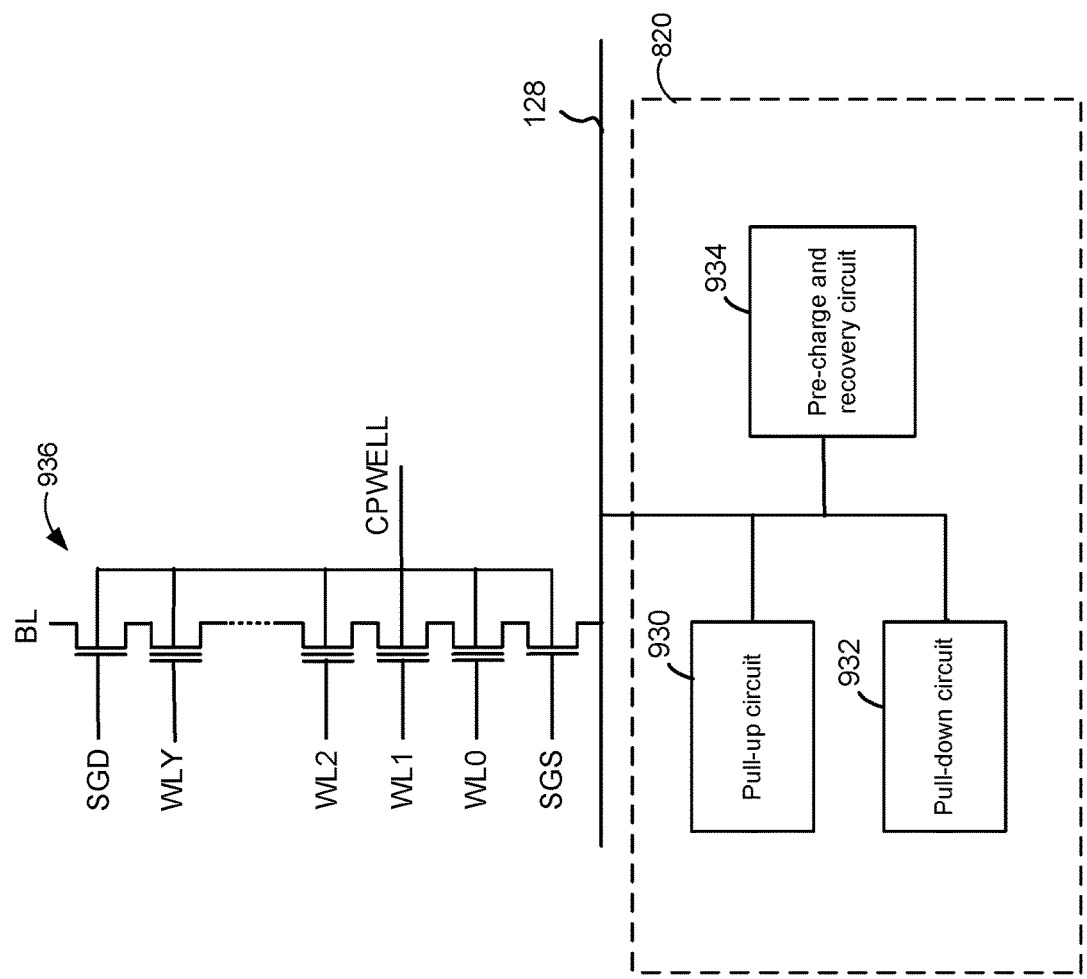
FIGS. 9A-B illustrate example circuits for implementing source line control circuits.

FIG. 9A illustrates an example implementation of source line control circuits 820. Source line control circuits 820 include a pull-up circuit 930 (pull-up driver), pull-down circuit 932 (pull-down driver), and pre-charge and recovery circuit 934. Pull-up circuit 930 may be implemented by any suitable circuit, for example, a comparator that compares a voltage on source line 128 with a reference voltage (e.g. target voltage, or some voltage close to the target voltage) and provides current to source line 128 when the voltage drops below the reference voltage. Pull-down circuit 932 may be implemented by any suitable circuit, for example, using feedback to couple source line 128 to ground when a voltage on source line 128 exceeds a reference (e.g. exceeds the target voltage, or some voltage close to the target voltage).

FIG. 9A also shows a connection (CPWELL) to a p-well that is coupled to NAND string 936 (while one NAND string is shown for illustration, it will be understood that a number of NAND strings may be connected to source line 128 and may share a common p-well). For example, CPWELL may be connected to p-well 320 to allow biasing of p-well 320. In an embodiment, source line control circuits 820 are connected to CPWELL to provide the same voltage on p-well 320 as provided on source line 128. This connection may be configurable (e.g. by one or more switches, not shown in FIG. 9A) so that p-well 320 and source line 128 may be commonly biased during some operations (e.g. read and verify) and may be separately biased at other times.

Figure 9B:
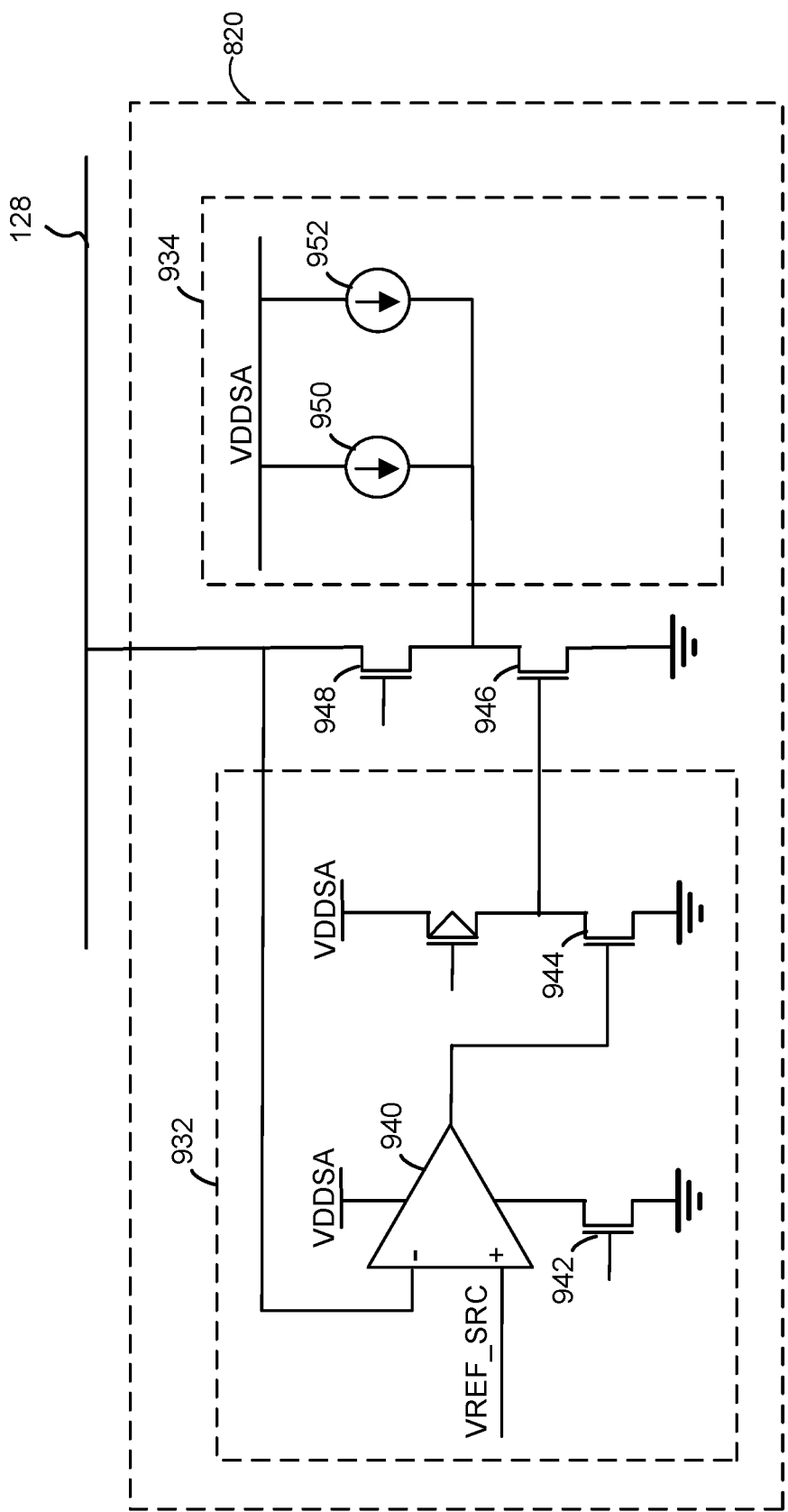

FIG. 9B illustrates an example implementation of certain components of source line control circuits 820 including pull-down circuit 932 and pre-charge and recovery circuit 934. Pull-down circuit 932 includes an op-amp 940 connected between a supply voltage VDDSA and, through switch 942 (implemented by an NMOS transistor in this example) to ground. (Various switches in the present illustrations are shown as implemented by transistors although any suitable switching element may be used). Op-amp 940 receives a reference voltage, VREF_SRC, and a feedback voltage from source line 128 and generates an output that is proportional to the difference (e.g. VREF_SRC may be a target voltage for source line 128). Op-amp 940 controls the voltage on the gate of transistor 944, which controls the voltage on the gate of transistor 946, which couples source line 128 to ground to allow source line 128 to be pulled-down from a higher voltage by discharging current from source line 128 to ground. A switch, implemented by transistor 948, allows connection/isolation of source line control circuits 820 and source line 128.

Pre-charge and recovery circuit 934 is shown as including two current sources in this example. It will be understood that more than two different currents may be generated by such a circuit (e.g. for different operations including read, write, and erase). Current source 950 is configured to generate a first current (pre-charge current) to increase voltage on source line 128 from an initial voltage (e.g. at or near ground or 0 volts) to a target voltage (e.g. 1.1 volts). For example, current source 950 may provide a pre-charge current (or first current) during pre-charge step 700, prior to a first sense step (e.g. first read step or verify step associated with a first data state). Current source 952 is configured to generate a second current (recovery current) to increase voltage on source line 128 from a reduced voltage that may occur after a sense step (e.g. due to coupling of locked out bitlines) to the target voltage. For example, current source 952 may provide a recovery current (or second current) during recovery periods 704, 708, 712, and/or any additional recovery periods. A pre-charge current generated by current source 950 may be different to a recovery current generated by current source 952 (e.g. pre-charge current may be greater than recovery current). In an embodiment, a recovery current generated by current source 952 is configurable so recovery current is provided at a selected current level that is selected from a plurality of current levels. This allows tuning of recovery voltage in a die or a portion thereof. For example, recovery current in a memory die may be tuned by a parameter (e.g. stored indicator of recovery current level) that is set in an initialization process according to test results obtained during testing of the die (e.g. during die sort). The parameter may be stored in a dedicated data storage unit or in shared data storage (e.g. in memory array 501). In some cases, the parameter may be one-time configurable and may be stored in a one-time writable data storage unit. In some cases, the parameter may be rewritable (e.g. based on additional testing, changing memory characteristics, or other factors).

While pre-charge and recovery circuit 934 is shown as including two separate current sources, current source 950 and current source 952, it will be understood that these, and any additional current sources, may be implemented in a variety of different ways and that a common circuit may be used to generate two or more different currents at different times (the separate current sources shown are illustrative of the concept of a circuit providing two or more different currents and does not limit the present technology to any particular implementation that would require physically separate current sources). In some cases, in addition to providing the first and second currents described above, a pre-charge and recovery circuit may generate a third current ("keeper current") which may remain on throughout read or verify operations (e.g. from time t0 through t7 until the end of the last sense step in FIG. 7).

Figure 10:
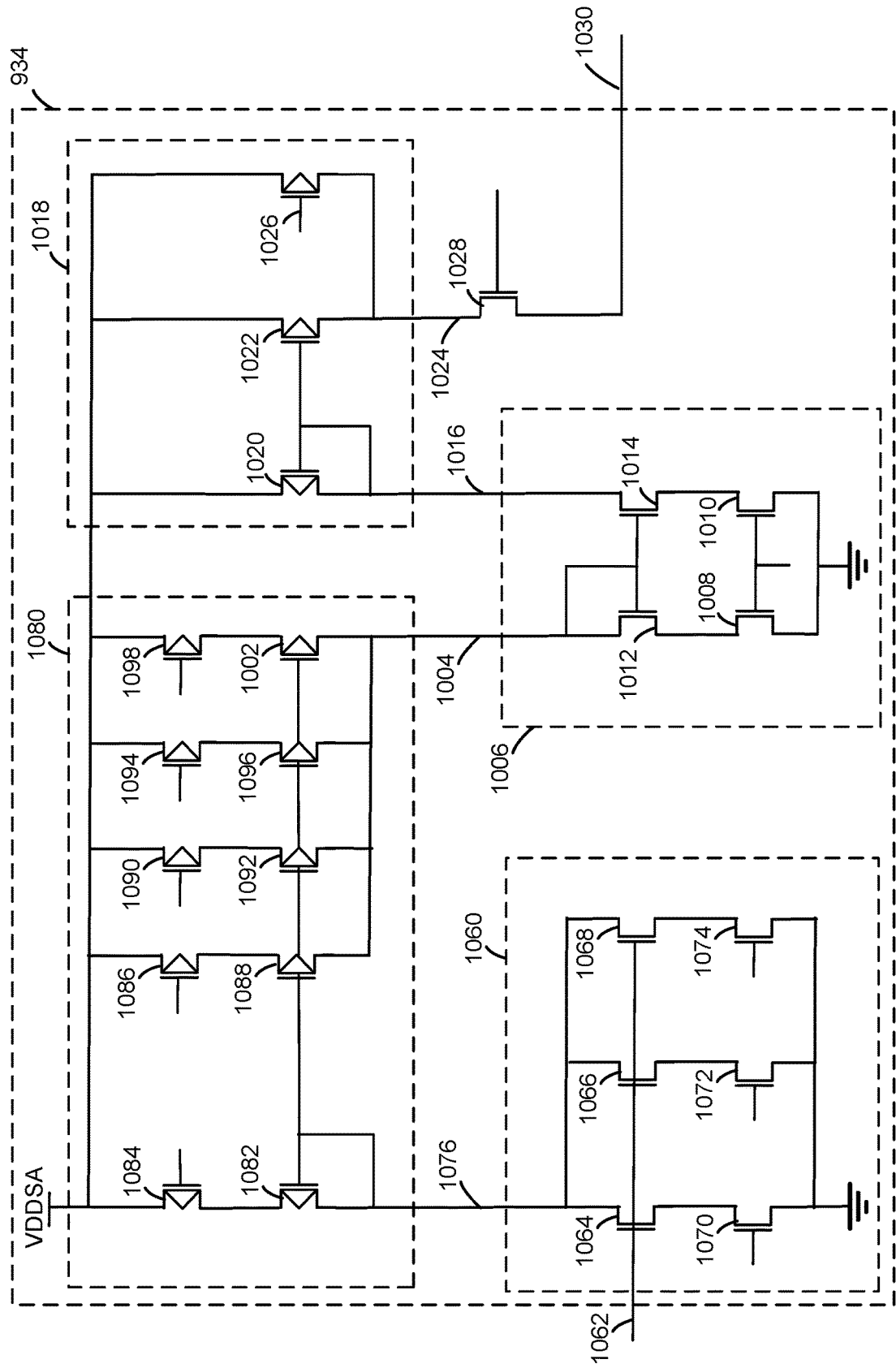
FIG. 10 illustrates an example circuit for implementing a pre-charge and recovery circuit.

FIG. 10 illustrates an example of an implementation of pre-charge and recovery circuit 934 that is configured to provide a first current (pre-charge current) at a first current level for pre-charging source line 128 to a target voltage (e.g. in pre-charge 700) and provide a second current (recovery current) at a second current level to return source line 128 to the target voltage during a recovery period (e.g. in recovery period 704, 708 or 712), where the second current is provided at a current level that may be selected from a plurality of different current levels.

Pre-charge and recovery circuit 934 includes a reference current circuit 1060 that can generate a reference current at a selected reference current level (e.g. select from among two or more reference current levels). An external reference current is received on line 1062, which is connected to gates of transistors 1064, 1066, and 1068. Transistor 1064 is connected in series with enabling transistor 1070 (enabling switch), transistor 1066 is connected in series with enabling transistor 1072 to form a second branch in parallel with transistor 1064 and enabling transistor 1070. Transistor 1068 is connected in series with enabling transistor 1074 to form a third branch in parallel with the second branch. In this configuration, a reference current, based on an external reference current received on line 1062, may be enabled by enabling transistor 1070. Turning on enabling transistor 1072 allows additional current based on the reference current to flow through transistor 1066 (e.g. flow through second branch in parallel). Turning on enabling transistor 1074 allows additional current based on the reference current to flow through transistor 1068 (e.g. flow through third branch in parallel). By turning on one or both of enabling transistors 1072, 1074, a reference current provided by reference current circuit 1060 on line 1076 may be configured at different reference current levels (e.g. three levels) where the reference current is the sum of the currents produced by enabled branches. Currents provided by each branch may be the same or different branches may provide different currents.

A selected reference current generated by reference current circuit 1060 is provided to first current mirror 1080 where it flows through transistor 1082 and enabling transistor 1084 (PMOS transistors in this example). Enabling transistor 1084 is connected to a supply voltage, VDDSA, and is configured to enable/disable pre-charge and recovery circuit 934. The reference current generated by reference current circuit 1060 flows through transistor 1082 when enabling transistor 1084 is turned on and this reference current may be mirrored by one or more branches of first current mirror 1080. A first branch includes transistor 1086 and transistor 1088, which is configured to mirror reference current in transistor 1082. A second branch includes transistor 1090 and transistor 1092, which is configured to mirror reference current in transistor 1082. A third branch includes transistor 1094 and transistor 1096, which is configured to mirror reference current in transistor 1082. A fourth branch includes transistor 1098 and transistor 1002, which is configured to mirror reference current in transistor 1082. In this configuration, one or more branch may be enabled by transistors 1086, 1090, 1094, 1098 (which are implemented by PMOS transistors in this example and may be implemented by any suitable switching element). Each branch may be configured to produce the reference current of transistor 1082 (e.g. to mirror exactly to provide the same current level). Branches may be configured to provide different currents (e.g. some multiple of the reference current in transistor 1082) by appropriate configuration of transistors 1088, 1092, 1096, 1002. A given branch may be configured to provide current at different levels, for example by applying different gate voltages. Thus, by selecting an appropriate branch or branches, and applying appropriate gate voltage in the selected branch or branches, first current mirror 1080 may produce a wide range of currents from a reference current at any given level.

The output current from first current mirror 1080 (e.g. some multiple of reference current generated by reference current circuit 1060) is provided on line 1004 to second current mirror 1006. Second current mirror 1006 includes a pair of enabling transistors 1008 and 1010 to enable/disable second current mirror 1006. Gates of enabling transistors 1008 and 1010 are connected together and receive an enable/disable signal. Transistors 1012 and 1014 are arranged in a current mirror configuration so that the current from line 1004, which passes through transistor 1012 is mirrored by current flowing through transistor 1014 and line 1016. Transistors 1012 and 1014 may be configured so that the current in transistor 1014 is a multiple of the current in transistor 1012 (e.g. five or ten times the current). Thus, the current provided on line 1016 may be a multiple of the current on line 1004.

The output current from second current mirror 1006 is provided to third current mirror 1018. Third current mirror 1018 includes transistors 1020 and 1022 in a current mirror configuration so that current through transistor 1022 mirrors current through transistor 1020. Current through transistor 1022 may be a multiple of current through transistor 1020 (e.g. forty or eighty times the current). Thus, the current provided by transistor 1022 on line 1024 may be a multiple of current on line 1016 (which may be a multiple of current on line 1004). Thus, second and third current mirrors may generate a relatively large current from a relatively small current output generated by first current mirror 1080, which in turn is generated from a reference current from reference current circuit 1060. A bypass transistor 1026 allows line 1024 to be directly connected to supply voltage VDDSA (e.g. for programming of memory cells). Transistor 1028 is connected to line 1024 to couple line 1024 to output line 1030. Transistor 1028 may be a depletion type transistor and may be operated in different modes according to the operation being performed. Output line 1030 may be coupled to a node between transistors 946 and 948 as illustrated in FIG. 9B to provide various currents to thereby control the voltage of source line 128.

Pre-charge and recovery circuit 934 implemented as shown in FIG. 10 can provide current at various levels. For example, when pre-charging source line 128, multiple branches of first current mirror 1080 may be enabled (e.g. all branches may be enabled by enabling transistors 1086, 1090, 1094, 1098) to boost voltage rapidly. A large reference current may be generated by reference current circuit 1060 (e.g. by enabling one or both of enabling transistors 1066 and 1068). The resulting pre-charge current may be provided for a predetermined time or may terminate when source line 128 reaches a target voltage (e.g. as indicated by a feedback signal). In some cases, different components may have different timing (e.g. different branches of first current mirror 1080 may turn off at different times). For example, transistor 1002 may drive a high current and may be enabled for a predetermined period of time (providing boost assist) so that enabling transistor 1098 is turned on for a short period (e.g. 5-10 nanoseconds) while one or more other branch is controlled based on feedback (e.g. enabling transistors 1086, 1090, 1094 may be turned on for pre-charging and may be turned off in response to a feedback signal indicating that source line 128 is at a target voltage).

In an embodiment, a first configuration of pre-charge and recovery circuit 134 is used for pre-charging source line 128 (e.g. in pre-charge step 700) and a second configuration is used for recovery (e.g. in recovery period 704). This may result in different currents being provided in these different steps. For example, pre-charging may include use of a high current for a short, predetermined time and use of an additional current for a time that depends on feedback control as described above.

In contrast to pre-charging, recovery may include use of a recovery current for a predetermined time (e.g. the entire recovery period or a fixed portion thereof) without using a feedback signal. An appropriate current level may be selected for the recovery current to ensure that applying the recovery current at a constant level for the recovery period results in source line 128 reaching and becoming stable at the target voltage within the recovery period. In an embodiment, the recovery current may be selected to ensure this (e.g. a current level for the recovery current may be selected from a range of recovery current levels that can be generated by pre-charging and recovery circuit 934. For example, during testing, different current levels may be tested, and a suitable current level may be found for a memory die. This current level is then stored as a parameter (indicator of current level) so that subsequent operations use the selected current level. The parameter may be stored in any suitable data storage (e.g. in memory array 501 or some other non-volatile memory or data storage unit).

In an example, recovery current may be specified by a two-bit indicator that may control current provided by a branch of first current mirror 1080. For example, different voltages may be applied to the gate of transistor 1090 to generate different currents during a recovery period that extends between successive sense steps. Other branches of first current mirror 1080 may be off during a recovery period (e.g. transistors 1086, 1094, 1098 may be off during a recovery period). In addition to current mirror being configurable to generate a recovery current at four different current levels, reference current circuit 1060 may generate a reference current at two different current levels. Table 1 illustrates an example of a plurality of different current levels that may be used for a recovery current based on a two-bit recovery current parameter and a one-bit reference current parameter.

TABLE 1

| Recovery current parameter value (two-bit value) | | Ref. current 1 | Ref. current 2 |
|---|---|---|---|
| 0 | 0 | 0.0 | 0.9 |
| 0 | 1 | 1.1 | 1.5 |
| 1 | 0 | 2.2 | 3.0 |
| 1 | 1 | 3.3 | 4.4 |

The two columns on the left show the two-bit recovery current parameter, which may be used to generate a two-bit control signal controlling gate voltage applied to transistor 1090. The two columns on the right show the resulting currents (in milliamps) for two reference current levels (e.g. corresponding to turning on either enabling transistor 1072 or enabling transistor 1074 in reference current circuit 1060.

FIG. 10 includes a number of transistors (e.g. transistors 1070, 1072, 1074, 1084, 1086, 1090, 1094, 1098, 1008, 1010, and 1028) in pre-charging and recovery circuit 934 that are controlled to implement aspects of the present technology. Control signals for these transistors may be generated by appropriate control circuits (e.g. control circuitry 510, which may be provided on a memory die or may be on the same die as a memory controller). Pre-charging and recovery circuit 934 may be considered a means for applying a pre-charge current to the source line for pre-charging the source line to a target voltage for sensing data states of the plurality of memory cells and providing a recovery current to the source line to return the source line to the target voltage in a recovery period between sensing data states, while control circuitry 510 may be considered a means for selecting a recovery current level for the recovery current from a plurality of recovery current levels (e.g. by providing appropriate control signals to one or more transistors of pre-charging and recovery circuit 934). Both pre-charging and recovery circuit 934 and control circuitry 510 may be located on a memory die or may be located on a control die that is bonded to a memory die in an integrated memory assembly. Memory array 501 or a data storage unit in or connected to control circuitry 510 may be considered a means for storing an indicator of the recovery current level.

Figure 11:
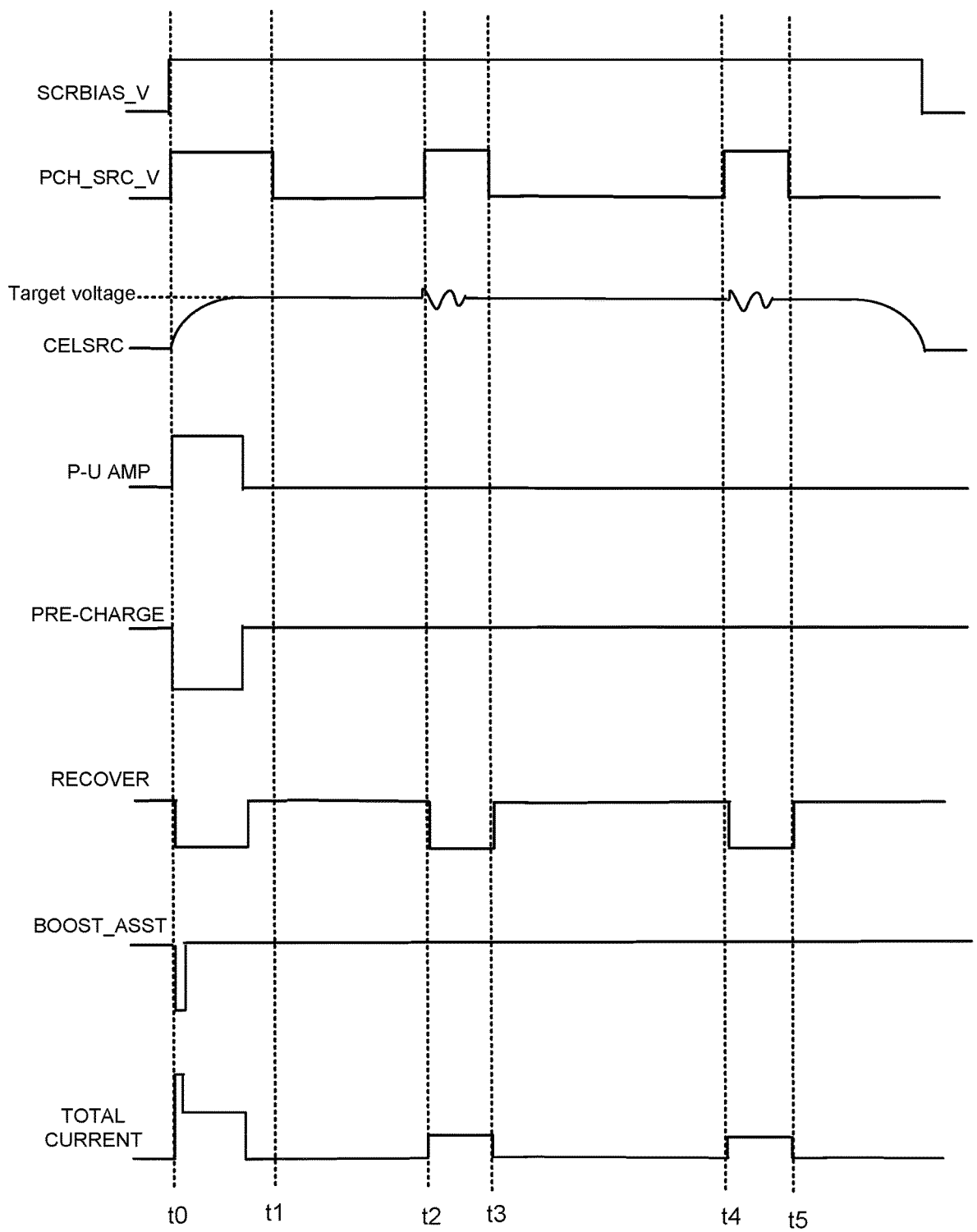
FIG. 11 illustrates an example of a timing diagram showing sensing steps and recovery periods.

FIG. 11 is a timing diagram illustrating features of pre-charge and recovery circuit 934 in a verify operation that includes recovery periods between verify steps as previously illustrated in FIG. 7. A first control signal, SCRBIAS_V enables pre-charge and recovery circuit 934 (e.g. turning one or more enabling transistor shown in FIG. 10) to allow voltage on source line 128 to be brought to and maintained at a target voltage for sensing (verifying in this example). A second control signal, PCH_SCR_V enables pre-charging and recovery (e.g. recovery periods of fixed duration in-between). Voltage on source line 128, CELSRC (cell source voltage), is shown increasing from a low voltage (e.g. at or near 0 volts) to the target voltage (e.g. 1.1 volts) in the pre-charge period from time t0 to t1. It can be seen that some instability occurs in CELSRC during recovery periods from t2 to t3 and t4 to t5. Using the present technology generally allows CELSRC to be stable at the target voltage by the end of a recovery period (e.g. at t3 or t5). Operation of a pull-up amplifier connected to source line 128 is shown by P-U AMP, which turns on at t0 and turns off in response to a feedback signal (e.g. pull-up amplifier may be a comparator using target voltage as a reference and may switch off when CELSRC reaches the target voltage). The pull-up amplifier is not turned on in recovery periods. A pre-charge signal, PRE-CHARGE, goes low (on) at t0 and goes high (off) in response to a feedback signal (like the pull-up amplifier). PRE-CHARGE may be provided to one or more enable transistors during pre-charging (e.g. to enable transistors 1086 and 1094) to enable corresponding branches of first current mirror 1080. A recovery signal, RECOVER, goes low at t0 and goes high in response to a feedback signal (like PRE-CHARGE). Subsequently, RECOVER goes low during recovery periods, e.g. from t2 to t3 and from t4 to t5. A boost assist signal, BOOST_ASST, goes low (on) at t0 and remains low for a short period (e.g. 5-10 nanoseconds) to enable a high current for a short period. For example, BOOST_ASST may be provided to transistor 1098 to enable current flow (at a high current level) through the corresponding branch of first current mirror 1080. Total current generated by pre-charge and recovery circuit 934 is shown including a high current following t0, corresponding to the high voltage enabled by BOOST_ASST, followed by a lower current (pre-charge current at a pre-charge level) corresponding to PRE-CHARGE and RECOVER, ending in response to a feedback signal (not continuing for a predetermined period, e.g. not continuing until t1).

In the first recovery period, a relatively low current (compared with the pre-charging current from t0 to t1) is provided throughout the period from t2 to t3 (i.e. at a constant current level throughout the recovery period indicated by PCH_SCR_V). Similarly, in the second recovery period, the relatively low current is provided throughout the time from t4 to t5 (at the same constant current level throughout this period). Subsequent recovery periods may use the same relatively low recovery current throughout the recovery period. The current level applied during recovery periods may be selected as previously described to ensure that CELSRC is returned to the target voltage and can stabilize within the time of a recovery period (e.g. from t2 to t3). In some cases, a keeper current may be provided throughout the time that SCRBIAS_V is on so that some relatively small current flows throughout this time, including during sense steps (e.g. between t1 and t2).

Figure 12A:
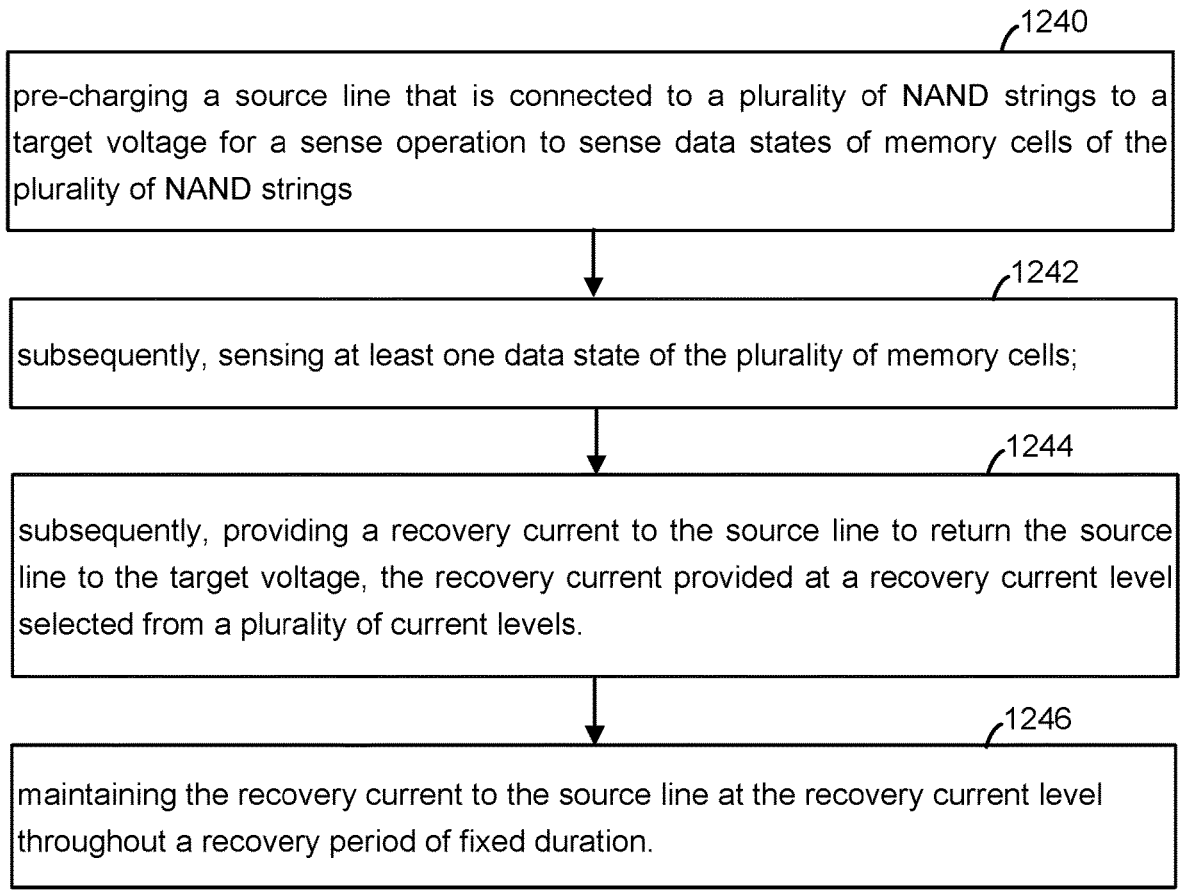
FIGS. 12A-B illustrate methods according to examples of the present technology.

FIG. 12A illustrates an example of a method that includes pre-charging a source line that is connected to a plurality of NAND strings to a target voltage for a sense operation to sense data states of memory cells of the plurality of NAND strings 1240 (e.g. from time t0 to t1 in FIG. 11) and subsequently, sensing at least one data state of the plurality of memory cells 1242 (e.g. S0, S1, S2 or other data state). The method further includes subsequently providing a recovery current to the source line to return the source line to the target voltage, the recovery current provided at a recovery current level selected from a plurality of current levels 1244 (e.g. current levels illustrated in Table 1) and maintaining the recovery current to the source line at the recovery current level throughout a recovery period of fixed duration 1246 (e.g. continuing for a fixed period and not terminating in response to a feedback signal). Steps 1244 and 1246 may be repeated according to the number of data states to be sensed. Where corresponding circuits (e.g. pre-charging and recovery circuit 934 and control circuitry 510) are located in a memory die, steps 1240, 1242, 1244, 1246 may be performed in memory die. Where corresponding circuits are located in a control die (e.g. in a control die bonded to a memory die), steps 1240, 1242, 1244, 1246 may be performed in the control die.

Figure 12B:
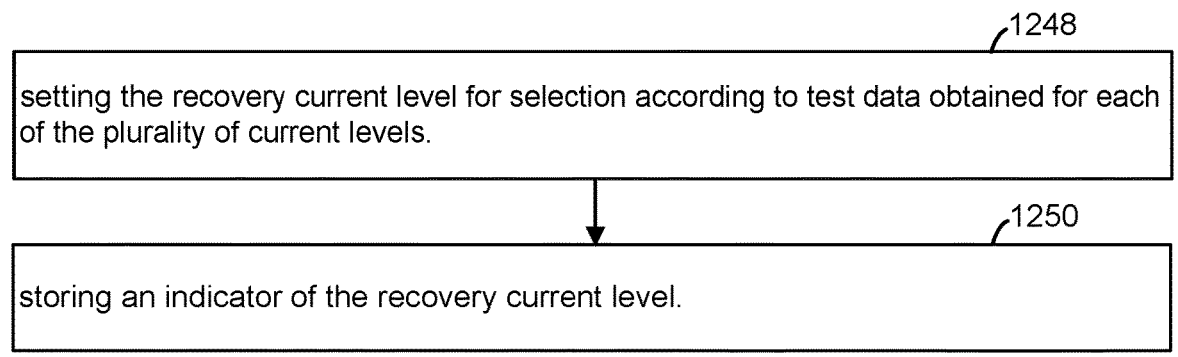

FIG. 12B illustrates an example of a method that includes setting the recovery current level for selection according to test data obtained for each of the plurality of current levels 1248 and storing an indicator of the recovery current level 1250 (e.g. a two bit indicator as illustrated in Table 1). These steps may be performed prior to the steps illustrated in FIG. 12A (e.g. during testing or configuration of a memory die or memory system).

An example of an apparatus includes a plurality of memory cells arranged in a plurality of NAND strings that are connected to a source line and a control circuit connected to the source line, the control circuit configured to provide a first current to the source line to pre-charge the source line to a target voltage for sensing data states of the plurality of memory cells and provide a second current to the source line to return the source line to the target voltage in a recovery period between sensing data states, the control circuit configured to provide the second current at any one of a plurality of current levels.

In an example, the second current is less than the first current. In an example, the control circuit is configured to provide the second current throughout the recovery period and the recovery period is of fixed duration. In an example, the control circuit is configured to provide the first current to the source line to pre-charge the source line for a pre-charge period that terminates in response to the source line reaching the target voltage. In an example, the control circuit is configured to obtain a stored indicator of a selected current level from a data storage unit and generate the second current at the selected current level indicated by the stored indicator. In an example, the data storage unit is a one-time writable data storage unit. In an example, the plurality of current levels includes at least four different non-zero current levels. In an example, the at least four different non-zero current levels are in a range of about 1 milliamp to about 5 milliamps. In an example, the plurality of memory cells are located on a memory die that is bonded to a control die which includes the control circuit.

An example of a method includes generating a pre-charge current for pre-charging a source line that is connected to a plurality of NAND strings to a target voltage for a sense operation to sense data states of a plurality of memory cells of the plurality of NAND strings, subsequently, sensing at least one data state of the plurality of memory cells, and subsequently, generating a recovery current to return the source line to the target voltage, the recovery current provided at a recovery current level selected from a plurality of current levels.

In an example, the method further includes maintaining the recovery current to at the recovery current level throughout a recovery period of fixed duration. In an example, pre-charging the source line includes providing a pre-charge current at a pre-charge level that is greater than the recovery current level. In an example, the method further includes terminating generating the pre-charge current in response to the source line reaching the target voltage. In an example, the method further includes setting the recovery current level for selection according to test data obtained for each of the plurality of current levels. In an example, the method further includes storing an indicator of the recovery current level. In an example, the recovery current level is selected by selecting a reference current level from two or more reference current levels and selecting one or more branches of a plurality of branches of a current mirror to mirror the selected reference current at one or more predetermined ratios. In an example, the plurality of memory cells are configured for a first number of data states, each data state is separately sensed in a sense step, and a recovery period extends between successive sense steps. In an example, each recovery period has fixed duration and the recovery current is maintained at the recovery current level throughout each recovery period. In an example, the pre-charge current and the recovery current are generated by pre-charge and recovery circuit located in a control die and the sensing is performed by sense circuits in the control die An example of an apparatus includes means for applying a pre-charge current to a source line of a NAND memory structure for pre-charging the source line to a target voltage for sensing data states of the plurality of memory cells and providing a recovery current to the source line to return the source line to the target voltage in a recovery period between sensing data states, and means for selecting a recovery current level for the recovery current from a plurality of recovery current levels.

In an example, the apparatus further includes means for storing an indicator of the recovery current level. In an example, the apparatus further includes a memory die, the NAND memory structure in the memory die, wherein the means for applying the pre-charge current and the means for selecting a recovery current are in a control die that is bonded to the memory die.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
    a plurality of memory cells arranged in a plurality of NAND strings that are connected to a source line; and
    a control circuit connected to the source line, the control circuit configured to provide a first current to the source line to pre-charge the source line to a target voltage for sensing data states of the plurality of memory cells and provide a second current to the source line to return the source line to the target voltage in a recovery period between sensing data states, the control circuit configured to provide the second current at any one of a plurality of current levels.

2. The apparatus of claim 1, wherein the second current is less than the first current.

3. The apparatus of claim 1, wherein the control circuit is configured to provide the second current throughout the recovery period and the recovery period is of fixed duration.

4. The apparatus of claim 1, wherein the control circuit is configured to provide the first current to the source line to pre-charge the source line for a pre-charge period that terminates in response to the source line reaching the target voltage.

5. The apparatus of claim 1, wherein the control circuit is configured to obtain a stored indicator of a selected current level from a data storage unit and generate the second current at the selected current level indicated by the stored indicator.

6. The apparatus of claim 5, wherein the data storage unit is a one-time writable data storage unit.

7. The apparatus of claim 1, wherein the plurality of current levels include at least four different non-zero current levels.

8. The apparatus of claim 7, wherein the at least four different non-zero current levels are in a range of about 1 milliamp to about 5 milliamps.

9. The apparatus of claim 1, wherein the plurality of memory cells are located on a memory die that is bonded to a control die which includes the control circuit.

10. A method, comprising:
    generating a pre-charge current for pre-charging a source line that is connected to a plurality of NAND strings to a target voltage for a sense operation to sense data states of a plurality of memory cells of the plurality of NAND strings;
    subsequently, sensing at least one data state of the plurality of memory cells; and
    subsequently, generating a recovery current to return the source line to the target voltage, the recovery current provided at a recovery current level selected from a plurality of current levels.

11. The method of claim 10, further comprising maintaining the recovery current at the recovery current level throughout a recovery period of fixed duration.

12. The method of claim 10, wherein pre-charging the source line includes providing a pre-charge current at a pre-charge level that is greater than the recovery current level.

13. The method of claim 12, further comprising terminating generating the pre-charge current in response to the source line reaching the target voltage.

14. The method of claim 10, further comprising, setting the recovery current level for selection according to test data obtained for each of the plurality of current levels.

15. The method of claim 14, further comprising, storing an indicator of the recovery current level.

16. The method of claim 10 wherein the recovery current level is selected by selecting a reference current level from two or more reference current levels and selecting one or more branches of a plurality of branches of a current mirror to mirror the selected reference current at one or more predetermined ratios.

17. The method of claim 10, wherein the plurality of memory cells are configured for a first number of data states, each data state is separately sensed in a sense step, and a recovery period extends between successive sense steps.

18. The method of claim 17 wherein each recovery period has fixed duration and the recovery current is maintained at the recovery current level throughout each recovery period.

19. The method of claim 10 wherein the pre-charge current and the recovery current are generated by pre-charge and recovery circuit located in a control die and the sensing is performed by sense circuits in the control die.

20. An apparatus, comprising:
- means for applying a pre-charge current to a source line of a NAND memory structure for pre-charging the source line to a target voltage for sensing data states of a plurality of memory cells and providing a recovery current to the source line to return the source line to the target voltage in a recovery period between sensing data states; and
- means for selecting a recovery current level for the recovery current from a plurality of recovery current levels.

21. The apparatus of claim 20, further comprising means for storing an indicator of the recovery current level.

22. The apparatus of claim 20 further comprising a memory die, the NAND memory structure in the memory die, wherein the means for applying the pre-charge current and the means for selecting a recovery current are in a control die that is bonded to the memory die.

* * * * *